United States Patent [19]

Engelhardt

[11] 3,858,119

[45] Dec. 31, 1974

[54] FOLDED PUSH-PULL AMPLIFIER

[75] Inventor: Bjorn H. Engelhardt, North Kingstown, R.I.

[73] Assignee: Raytheon Company, Lexington, Mass.

[22] Filed: June 18, 1973

[21] Appl. No.: 370,894

[52] U.S. Cl. ........................ 330/15, 330/18, 330/22, 330/30 R

[51] Int. Cl. ............................................ H03f 3/26

[58] Field of Search...... 307/252 N, 252 W; 330/10, 330/15, 22, 122, 18, 30 R

[56] References Cited

UNITED STATES PATENTS 3,484,709 12/1969 Kabrick .......................... 330/122 X

*Primary Examiner*—Herman Karl Saalbach
*Assistant Examiner*—Lawrence J. Dahl
*Attorney, Agent, or Firm*—David M. Warren; Joseph D. Pannone; Milton D. Bartlett

[57] ABSTRACT

A push-pull amplifier circuit adapted to permit an amplifying element in one branch of the circuit to provide amplification during both positive and negative portions of an input signal. In a preferred embodiment of the invention, the circuit comprises an input transformer and an output transformer, an input terminal of the amplifying element being coupled via diode circuitry to both terminals of the secondary winding of the input transformer, an output terminal of the amplifying element being coupled via controlled rectifier circuitry to the two terminals of the primary winding of the output transformer, center tap of the input transformer secondary winding being coupled to a center tap of the output transformer primary winding and a source of power being applied between a third terminal of the amplifying element and the center taps. A control circuit coupled to the power supply and the terminals of the secondary winding of the input transformer operates the controlled rectifier circuitry for passing current from the amplifying element alternately through the terminals of the input winding of the output transformer.

7 Claims, 2 Drawing Figures

FOLDED PUSH-PULL AMPLIFIER

BACKGROUND OF THE INVENTION

A push-pull amplifier circuit is often used for power amplification of an input signal when it is desired to preserve symmetrical properties of the positive and negative portions of the input signal during the amplification process. Such circuits utilize paired amplifying elements with one element in each pair being utilized during a positive portion of the input signal while the other element of the pair of amplifying elements is utilized during the negative portion of the input signal.

A problem arises in that for precise reproduction of the input signal, it is preferable that the pair of amplifying elements be of matched gain elements. A further problem arises in that for high powered amplifying elements, it is necessary to provide two of these amplifying elements rather than a single such element as would be utilized in a typical Class A amplifier circuit with the attendant additional expense associated therewith. It is also apparent that in a push-pull amplifier configuration in which each amplifying branch comprises a set of serially connected amplifying elements such as that disclosed in the pending application, Ser. No. 291,119 entitled "Minimal Dissipation Power Controller" by Arent H. Kits van Heyningen and Bjorn H. Englehardt which was filed Sept. 21, 1972, the use of a push-pull configuration substantially increases the number of amplifying elements required in the amplifier circuit.

SUMMARY OF THE INVENTION

The aforesaid problems are overcome and other advantages are provided by an amplifier circuit, in accordance with the invention, which comprises an input transformer and an output transformer of which a center tap of the secondary winding of the input transformer is coupled to a center tap of the primary winding of the output transformer, the input transformer serving to couple the amplifier circuit to a signal source and the output transformer serving to couple the amplifier circuit to a load. An amplifying element having an input terminal and an output terminal has its input terminal coupled via diode circuitry to output terminals of the secondary winding of the input transformer, and has its output terminal coupled via switching circuitry, preferably in the form of controlled rectifiers, to the terminals of the primary winding of the output transformer. A control circuit responsive to the signals appearing at the terminals of the secondary winding of the input transformer operates the controlled rectifiers for alternately switching an output signal of the amplifying element between the terminals of the primary winding of the output transformer.

BRIEF DESCRIPTION OF THE DRAWINGS

The aforementioned aspects and other features of the invention are explained in the following description taken in connection with the accompanying drawings in which.

DESCRIPTION OF THE PREFERRED EMBODIMENT

Figure 1:
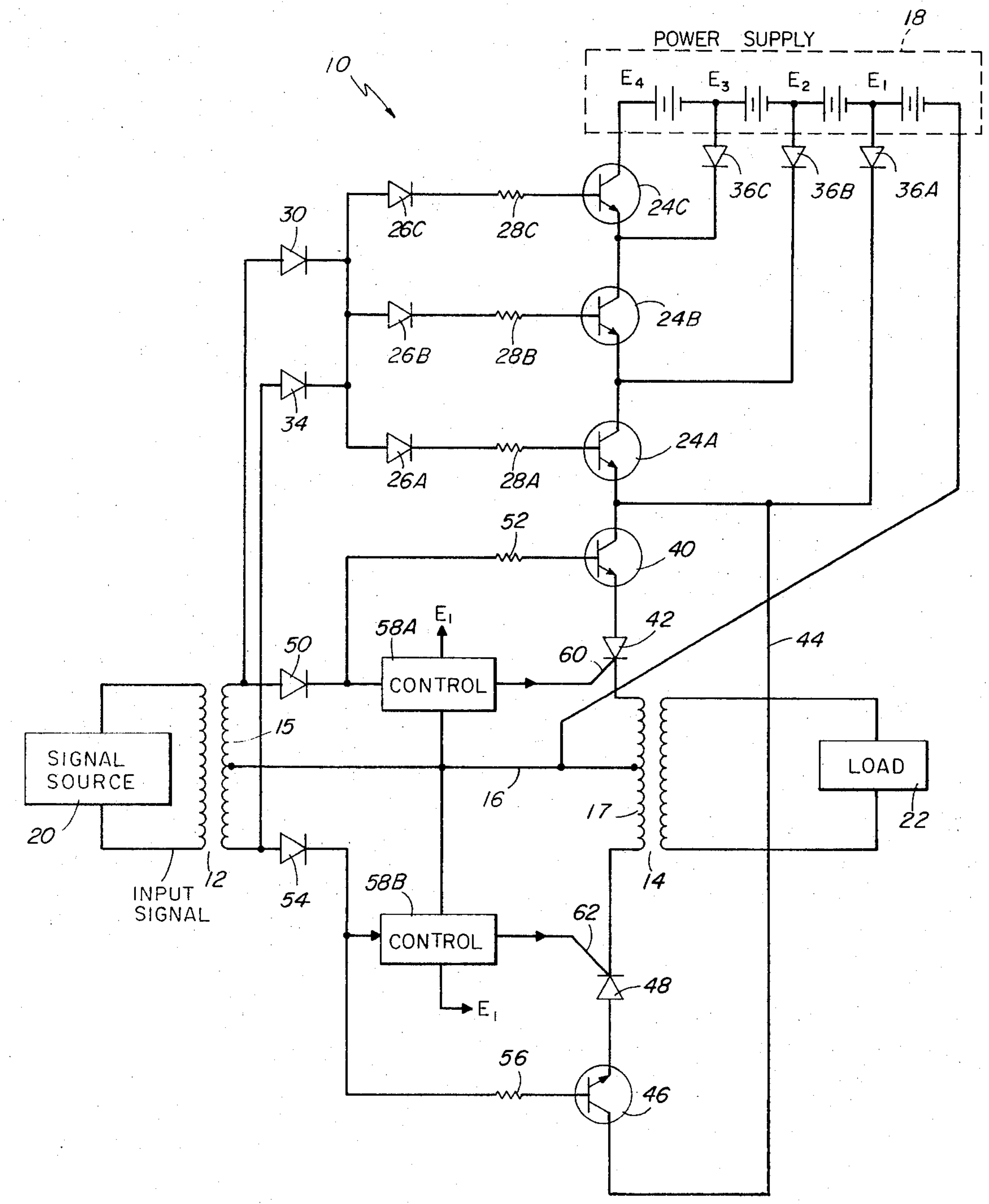
FIG. 1 and FIG. 2 are schematic diagrams of alternate embodiments of the amplifying circuit of the invention.

Referring now to FIG. 1, there is seen a schematic diagram of an amplifying circuit 10 which, in accordance with the invention, comprises an input transformer 12 and an output transformer 14, the center tap of the secondary winding 15 of the input transformer 12 being coupled via line 16 to the center tap of the primary winding 17 of the output transformer 14 and to a terminal of a power supply 18. The primary winding of the input transformer 12 is coupled to a signal source 20 which may provide, by way of example, a sinusoidal signal, and the output winding of the output transformer 14 is coupled to a load 22. The circuit 10 further comprises three serially connected transistors 24A–C for which base current is provided by respectively diodes 26A–C serially connected via resistors 28A–C to the base terminals of the transistors 24A–C. The anode terminals of the three diodes 26A–C are coupled together and are also coupled via diode 30 to the upper terminal of the winding 15 and via the diode 34 to the lower terminal of the winding 15. The power supply 18 is provided with terminals labeled E1, E2, E3 and E4, each of these terminals providing successively a more positive voltage, the terminal E4 being connected to the collector terminal of the transistor 24C, while the terminals E1, E2 and E3 are connected respectively via diodes 36A–C to the emitter terminals respectively of the transistors 24A–C.

The circuit 10 also shows the coupling of the emitter terminal of the transistor 24A to the upper terminal of the winding 17 via the serial interconnection of a transistor 40 and a controlled rectifier 42, the emitter terminal of the transistor 24A being similarly coupled along line 44 to the lower terminal of the winding 17 via the serially connected transistor 46 and controlled rectifier 48. The base terminal of the transistor 40 is coupled to the upper terminal of the winding 15 via the serial interconnection of a diode 50 and resistor 52; the base terminal of the transistor 46 is similarly connected to the lower terminal of the winding 15 via the serial interconnection of a diode 54 and resistor 56. A control circuit 58A is energized by a voltage applied thereto from the power supply 18 and has an input terminal connected to the diode 50 and an output terminal connected to a control terminal 60 of the controlled rectifier 42. A second control circuit 58B, which is identical to the control circuit 58A, is similarly energized by a voltage from the power supply 18 and has an input terminal connected to the diode 54 and an output terminal connected to a control terminal 62 of the controlled rectifier 48.

The operation of the circuit 10, particularly with respect to its folded push-pull characteristic, may be explained by considering initially only the amplification provided by the transistor 24A. During a positive half cycle of the signal provided by the signal source 20 when the upper terminal of the winding 15 is positive with respect to its center tap, base current flows from the winding 15 through the diodes 30 and 26A and the resistor 28A to the base terminal of the transistor 24A. Current from the power supply 18 passes through the transistor 24A via its collector and emitter terminals and through the transistor 40 and the controlled rectifier 42 to the upper terminal of the winding 17. During the negative portion of the signal of the signal source 20 when the lower terminal of the winding 15 is positive with respect to its center tap, base current is provided via the diodes 34 and 26A and the resistor 28A to the base terminal of the transistor 24A. The current exiting from the emitter terminal of the transistor 24A is then passed via line 44 through the transistor 46 and the controlled rectifier 48 to the lower terminal of the winding 17. The control circuits 58A–B are of a well-known form. In response to a current provided respectively by the diodes 50 and 54, each control circuit 58A–B provides a suitable voltage respectively at the control terminals 60 and 62 for activating respectively the controlled rectifiers 42 and 48 for passing the aforementioned currents respectively into the upper and lower terminals of the winding 17 in response to the appearance of a positive voltage respectively at the upper and lower terminals of the winding 15. Thus, it is seen that current flows through the transistor 24A during both halves of an input sinusoidal signal at the input transformer 12, this current being passed alternately in opposite directions through turns of the winding 17 of the output transformer 14 so that the circuit 10 functions as a push-pull amplifier.

The transistors 40 and 46 are utilized to improve termination of the current flowing respectively through controlled rectifiers 42 and 48 when the value of the signal at the winding 15 passes through zero. The two transistors 40 and 46 operate in a conventional push-pull mode with base current being provided via the diode 50 and resistor 52 to the transistor 40 during a positive portion of the input signal while base current is provided via the diode 54 and resistor 56 during a negative portion of the input signal. For high values of input signal voltage appearing at the winding 15, the transistors 40 and 46 are driven into a saturation mode and function, in combination with respectively the controlled rectifiers 42 and 48, as short circuits to current provided by the transistor 24A.

It is readily seen that transistors 40 and 46 are placed in a state of conduction by a lower value of input voltage than is required for the transistor 24A since the voltage drops across the transistors 40 and 46 serve as a source of bias voltage to the transistor 24A.

As was mentioned hereinbefore, a circuit utilizing serially connected amplifying elements such as he transistors 24A–C has been disclosed in a pending patent application entitled "Minimal Dissipation Power Controller", Ser. No. 291,119, filed Sept. 21, 1972 by A. H. Kits van Heyningen jointly with the present inventor, B. H. Engelhardt. As disclosed therein, such a circuit is useful for minimizing the power dissipated in each amplifying element during the various portions of the input signal (therein demonstrated for a sinusoidal input signal) since only one of the serially interconnected amplifying elements need be conducting during the lower voltage portions of the input signal. Accordingly, it is seen herein that the concept of a folded push-pull amplifier can be utilized also in the case of the serially interconnected amplifying elements which are shown herein as the transistors 24A–C. Thus, the preceding explanation is extended to include the transistors 24B and 24C from which it is readily seen that the voltage drop across the transistor 24A restricts activation of the transistor 24B to higher values of voltage of the input signal than is required for the activation of the transistor 24A. And similarly, still higher values of input signal voltage are required to activate the transistor 24C because of the additional bias voltage provided by the voltage drop across the transistor 24B. The current passing through the three transistors 24A–C is passed either via the transistor 40 and controlled rectifier 42 or via the transistor 46 and controlled rectifier 48 corresponding to the positive or negative portions of the input signal to the transformer 12 so that the circuit 10 operates as a folded push-pull amplifier in which the transistors 24A–C are utilized during both halves of the input signal. The diode 36C prevents current from flowing through the transistor 24C when the transistor 24B is nonconducting, the diodes 36A–B providing similar protection to the transistors 28A–B.

Figure 2:
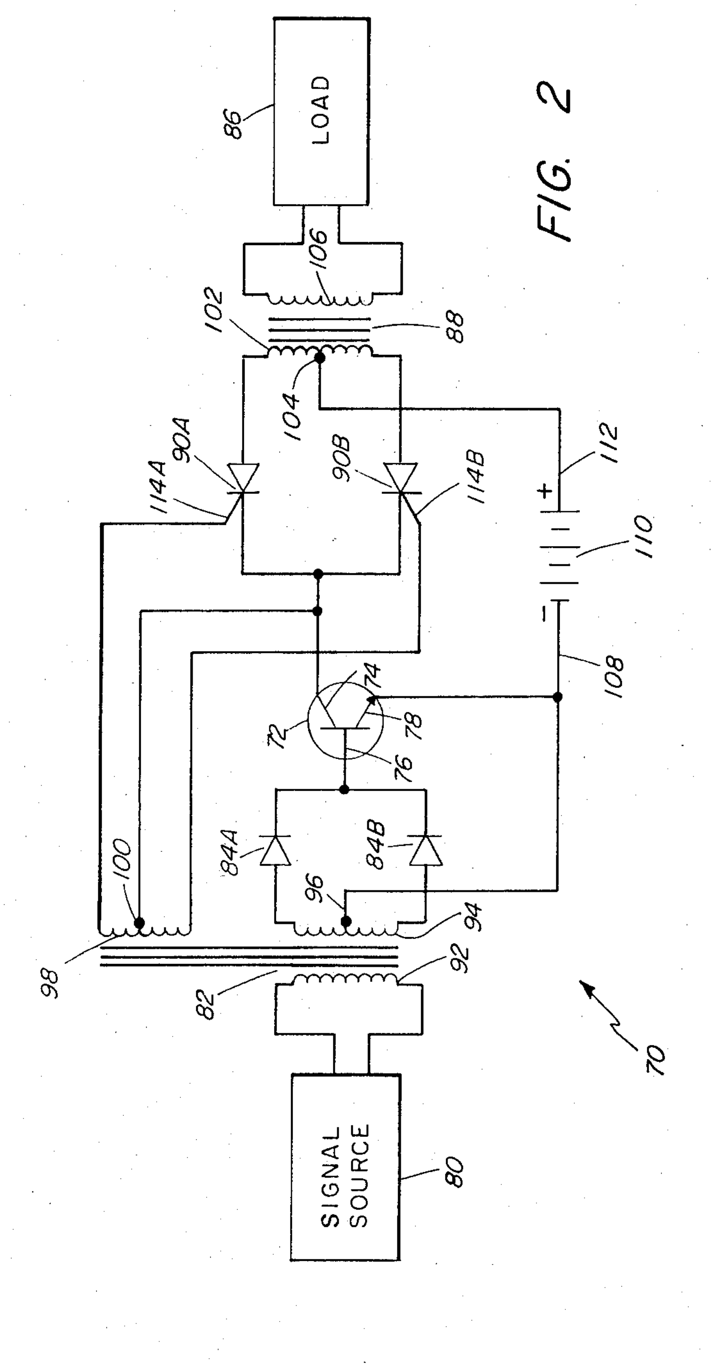

Referring now to FIG. 2, there is shown the circuit of an amplifier 70 which is an alternative embodiment of the invention. The amplifier 70 comprises a single transistor 72 having a collector electrode 74, a base electrode 76 and an emitter electrode 78, the transistor 72 serving as an amplifying element for amplifying an input signal provided by a signal source 80. The input signal is coupled from the signal source 80 to the transistor 72 by a transformer 82 and diodes 84A–B. The transistor 72 is coupled to a load 86 by a transformer 88 and a pair of switching elements here shown as controlled rectifiers 90A–B.

The transformer 82 comprises a primary winding 92, a secondary winding 94 having a center tap terminal 96, and a tertiary winding 98 having a center tap terminal 100. The transformer 88 comprises a primary winding 102 having a center tap terminal 104 and a secondary winding 106. The center tap terminal 96 and the emitter terminal 78 are connected to the negative terminal 108 of a suitable source of power such as a battery 100 while the positive terminal 112 is connected to the center tap terminal 104.

The anode terminals of the diodes 84A–B are connected to the opposite end terminals of the secondary winding 94 while the cathode terminals of the diodes 84A–B are coupled to the base terminal 76. The center tap terminal 100 is coupled to the collector terminal 74 and also to the cathode terminals of the controlled rectifiers 90A–B. The controlled rectifier 90A has a control electrode 114A which is connected to one end terminal of the tertiary winding 98 while the controlled rectifier 90B has a control terminal 114B which is connected to the opposite end terminal of the tertiary winding 98.

In operation, the amplifier 70 may be seen to operate as a push-pull amplifier in which the transistor 72 serves to amplify both the positive and the negative portions of the input signal. The diodes 84A and 84B serve to alternately switch the positive and negative portions of thhe input signal to the transistor 72 for amplifying the input signal, the amplified signal appearing at the collector terminal 74 from which it is switched alternately via the controlled rectifiers 90A and 90B to the appropriate terminal of the primary winding 102 in accordance with the positive or negative portion of the input signal.

In the circuit of FIG. 2, no resistor elements have been shown, such as resistors between the positive terminal 112 and the collector terminal 74 for protecting the transistor 72 from excessive current, nor a resistor in the base or emitter circuits of the transistor 72 for providing suitable bias voltages and bias currents since such circuitry elements and their interconnections are well known, and the novel features of the amplifier 70 are better explained without showing these additional circuitry elements. The switches 84A and 84B are operated by the voltage developed across the secondary winding 94 so that, assuming the input signal to have a sinusoidal form, the voltage polarity of the secondary winding 94 is seen to reverse periodically with each cycle of the sinusoid. The reversing polarity places the diode 84A in a state of conduction while the diode 84B is in a state of nonconduction during the positive half of the input signal while the diode 84B is in a state of conduction and the diode 84A is in a state of nonconduction during the other half of each cycle of the input signal. Thus, current provided by the secondary winding 94 circulates from the center tap terminal through the diode 84A and the transistor 72 during the positive half of each cycle of the input signal and via the diode 84B during the negative part of the cycle.

The voltage developed across the tertiary winding 98 is in step with the voltage developed across the secondary winding 94 with the result that, during the positive portion of the input signal a positive voltage appears between the collector electrode 74 and a control electrode 114A; and during the negative portion of a cycle of the input signal, the control electrode 114B is driven with a positive voltage relative to the collector electrode 74. In response to the voltages applied to the control electrodes 114A–B the controlled rectifiers 90A–B are made to conduct simultaneously with the states of conduction, respectively, of the diodes 84A–B. Thus, current representing the amplified signal passes from the collector terminal 74 through the transistor 72 to the emitter terminal 78, then via the battery 110 to the center tap terminal 104 where it splits alternately to flow either through the upper or the lower branch of the primary winding 102 via either the controlled rectifiers 90A or 90B back to the collector terminal 74.

It is understood that the above-described embodiments of the invention are illustrative only and that modifications thereof will occur to those skilled in the art. Accordingly, it is desired that this invention is not to be limited to the embodiment disclosed herein but is to be limited only as defined by the appended claims.

What is claimed is:

1. A circuit comprising:

a transformer having a plurality of terminals;

means coupled to a source of input signal for amplifying said signal; and switching means coupled between said amplifying means and each of said terminals of said transformer, said switching means sequentially connecting said amplifying means to successive ones of said transformer terminals for coupling said amplified signal during successive portions of said input signal to successive ones of said terminals of said transformer, said transformer serving to couple said power to a load.

2. A circuit according to claim 1 further comprising a second transformer for coupling said amplifying means and said switching means to said input signal.

3. A circuit according to claim 2 wherein said switching means comprises controlled rectifier means and a circuit responsive to the instantaneous value of said input signal for operating said controlled rectifier means during successive portion of said input signal.

4. A circuit according to claim 3 wherein said switching means further comprises a plurality of amplifiers coupled to respective ones of said controlled rectifier means for amplifying said input signal during predetermined portions of said input signal.

5. A circuit according to claim 4 further comprising a biasing circuit coupled between said amplifying means and said second transformer for activating said amplifying meand at values of said input signal which are greater than a value of said input signal which can be amplified by said amplifiers of said switching means.

6. An amplifier circuit comprising:

a plurality of serially connected transistors coupled together such that emitter current from one of said transistors flows through a second of said transistors;

diode means coupled to respective ones of the points of interconnection between said serially coupled transistors, said diode means coupling successive ones of said points of interconnection to successively greater values of electric potential;

means coupled to said serially coupled transistors for sequentially passing an input signal in accordance with the magnitude of said input signal to successive ones of said serially coupled transistors; and means coupled between the last one of said serially coupled transistors and the terminals of a load energizing circuit for switchably connecting said last one of said serially coupled transistors to individual ones of said terminals of said load energizing circuit.

7. A circuit according to claim 6 further comprising means coupled to said switching means and responsive to the amplitude of said input signal for operating said switching means when the value of said input signal amplitude attains a predetermined value.

* * * * *